United States Patent [19]

Takahashi

[11] Patent Number: 4,579,478

[45] Date of Patent: Apr. 1, 1986

[54] SHEET PART FIXING DEVICE

[75] Inventor: Norio Takahashi, Osaka, Japan

[73] Assignee: Nifco Inc., Yokohama, Japan

[21] Appl. No.: 685,697

[22] Filed: Dec. 24, 1984

[51] Int. Cl.[4] .......................... F16B 2/00; H01B 17/00
[52] U.S. Cl. .............................. 403/405.1; 403/406.1;
24/453; 24/573; 24/598; 24/297; 174/138 D;
361/412
[58] Field of Search .............. 403/405, 406, 407, 186;
24/453, 297, 326, 336, 458, 573, 598; 174/138
D; 361/412, 420; 339/17 C, 17 M

[56] References Cited

U.S. PATENT DOCUMENTS

| 4,100,368 | 7/1978 | Thomsen | 174/138 D |
| 4,376,605 | 3/1983 | Thomsen | 174/138 D X |
| 4,527,312 | 7/1985 | Ruehl et al. | 24/453 |

FOREIGN PATENT DOCUMENTS

| 51-39095 | 9/1976 | Japan | 174/138 D |
| 1541448 | 2/1979 | United Kingdom | 174/138 D |

Primary Examiner—Cornelius J. Husar
Assistant Examiner—Todd G. Williams
Attorney, Agent, or Firm—Trexler, Bushnell & Wolters, Ltd.

[57] ABSTRACT

A fixing device for joining two sheet parts as separated by a prescribed space from each other is disclosed which comprises a hinge part adapted to be bent perpendicularly, a base plate part connected to one end side of the hinge part and provided with a projecting fitting shank, and an engaging part connected to the other end side of the hinge part and provided with a pair of legs possessing engaging claws at the leading ends thereof and a retainer claw possessing an upwardly urged free end. By this fixing device, a lower sheet part is fixed in place by boring a hole in advance along one edge of the lower sheet part, inserting the fitting shank, and bending the hinge part perpendicularly thereby bringing the engaging claws into fast engagement with the lateral walls of the fitting shank and an upper sheet part is fixed in place by pressing the upper sheet part downwardly from above the engaging part held upright and allowing the upper sheet part to be nipped between the engaging claws and the top of the fitting shank.

2 Claims, 7 Drawing Figures

SHEET PART FIXING DEVICE

BACKGROUND OF THE INVENTION

This invention relates to a sheet part fixing device suitable for fixing two sheet parts as separated by a prescribed distance, particularly two printed circuit boards used in such electronic devices as television sets, radio sets, and communication machines.

In recent years, the demand for electronic devices with notably improved performance, e.g. large memory capacity, is growing. Meanwhile, the need to reduce the spaces occupied by parts of electronic devices is drawing increased attention. In electronic devices, the fact that the individual parts are fixed in their respectively exact positions is an indispensable requirement. Printed circuit boards are naturally required to be accurately and securely fixed as separated from chassis or other printed circuit boards.

As the sheet part fixing devices of this type, those disclosed by Japanese Utility Model Publication SHO 51(1976)-10359 and Japanese Utility Model Application Disclosure SHO 53(1978)-27460 and SHO 49(1974)-36450 have been known in the art. All are complicated in shape, difficult to mold, and deficient in strength and precision. They can be undone for replacement of a faulty printed circuit board only with great trouble, and rarely can be reused.

Owing to the growing demand for miniaturization of electronic devices, all their parts must be stowed efficiently in as small spaces as possible. If any part of the fixing device protrudes from the bottom surface of the printed circuit board, for example, it gives rise to wasted space.

An object of this invention is to provide a sheet part fixing device which takes up only a small fraction of the space occupied by the printed circuit boards being fixed therewith and yet retains the printed circuit boards accurately and strongly.

Another object of this invention is to provide a sheet part fixing device which enables sheet parts to be retained in a safely joined state in a small space without appreciably protruding from the bottom surface of the sheet part.

Yet another object of this invention is to provide a sheet part fixing device which has a simple structure and enables sheet parts to be easily fastened and unfastened.

SUMMARY OF THE INVENTION

The sheet part fixing device of this invention comprises, in integral combination, a hinge part adapted to be bent perpendicularly, a base plate part provided with a projecting fitting shank and connected to one end of the hinge part, and an engaging part connected to the other end of the hinge part and provided with a pair of legs each incorporating an inwardly projecting engaging claw and a tongue-shaped retainer claw possessing an upwardly urged free end.

When the aforementioned fitting shank is inserted upwardly into a hole bored in a horizontally disposed lower sheet part and the engaging part is raised upright by bending the hinge part, the engaging claws on the pair of legs come into fast engagement with the lateral walls of the fitting shank and the fixing device is fastened to the lower sheet part. When an upper sheet part is pressed down along the engaging part held upright, the tongue-shaped retainer claw is pushed down inside the engaging part. As the sheet part is pushed past the retainer claw, this retainer claw returns to its original position and, consequently, the upper sheet part is nipped between the lower end of the retainer claw and the top of the fitting shank. As a result, the upper sheet part is fixed in place as separated from the lower sheet part by a space equalling the height of the fitting shank.

The sheet part fixing device of this invention, as described above, accurately and safely fixes the lower sheet part exclusively by virtue of the hole bored near one edge thereof and the upper sheet part by virtue of small areas occupied by the contact between the part and the lower surface of the fitting shank and the contact between the part and the upper surface of the retainer claw. This fixing device permits efficient utility of fitting space because it protrudes from the bottom surface of the lower sheet part only to a distance equalling the thickness of the base plate. Separation of the fixed sheet parts from the fixing device is effected simply by depressing the retainer claw and pushing the pair of legs away from each other. The fixing device thus removed from the sheet parts can be effectively used again.

The other objects and characteristic features of the present invention will become apparent to those skilled in the art as the disclosure is made in the following description of preferred embodiments of the invention, as illustrated in the accompanying drawings.

DESCRIPTION OF PREFERRED EMBODIMENTS

Figure 1:
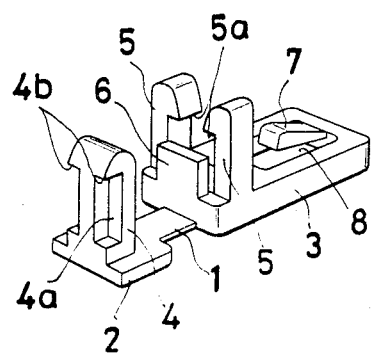
FIG. 1 is a perspective view of a sheet part fixing device as a typical embodiment of the present invention.

FIG. 1 through FIG. 5 illustrate the sheet part fixing device as the first embodiment of this invention. This sheet part fixing device has disposed on the opposite sides of a hinge 1 of a small thickness and a narrow width a fixing base plate 2 and an engaging part 3 which are integrally connected to each other in one plane through the medium of the hinge 1. The fixing base plate 2 is provided with a projecting fitting shank 4. On the other hand, the engaging part 3 is provided with a pair of projecting legs 5 separated by a fixed space from each other. The pair of legs 5 are provided at the leading ends thereof with engaging claws 5a projecting inwardly toward each other. The pair of engaging claws 5a are separated from each other by a space large enough to allow them to nip the fitting shank 4 tightly.

Optionally, a contact plate 6 is disposed in a protruding manner between the legs 5 of the engaging part and the hinge 1. In the leading end part of the engaging part extended past the legs 5, a U-shaped incision 8 is formed to give rise to a tongue-shaped retainer claw 7 which has one end thereof connected to the engaging part and the other free end thereof disposed as directed toward the legs 5. The leading end of the retainer claw 7 is urged upwardly by making use of the elasticity of plastic material.

The fitting shank 4 is nipped fast between the pair of legs 5 of the engaging part 3 when the hinge 1 is bent perpendicularly. To ensure perfect engagement between the claws 5a of the legs 5 and the fitting shank 4, the fitting shank 4 is provided on the end face thereof opposed to the hinge 1 with depressions 4a formed in the vertical direction along the opposite lateral edges thereof. These depressions end in a flange 4b on the upper sides thereof. This flange 4b prevents the engaging claws 5a of the legs 5 from slipping off the fitting shank upwardly. The opening formed in the base plate between the pair of legs 5 contributes to decreasing the weight of the fixing device and saving of raw material.

The fixing device constructed as described above can be integrally produced by the injection molding of synthetic resin which excels in various mechanical properties such as tensile strength, bending strength, and compressive strength, possesses high insulating property, and enjoys outstanding moldability. Examples of the resin are nylon 6 and nylon 66.

Now, the method for fixing sheet parts by the use of the fixing device of the aforementioned construction will be described below. Examples of the sheet parts for which the fixing device of this invention can provide effective union include chassis, printed circuit boards, and terminal boards for use in electronic devices. These sheet parts are required to be fixed in place as separated by a prescribed space from each other. Near one lateral edge of a sheet part $P_1$ destined to form the lower member of the union, a hole for passage of the fitting shank 4 is bored in advance. The size of this hole is large enough to pass the fitting shank 4 and small enough to stop passage of the base plate 2. The distance from this hole to the edge of the sheet part is such that when the fitting shank of the base plate is inserted through the hole in the sheet part, the edge of the sheet part will reach the hinge.

Figure 2:
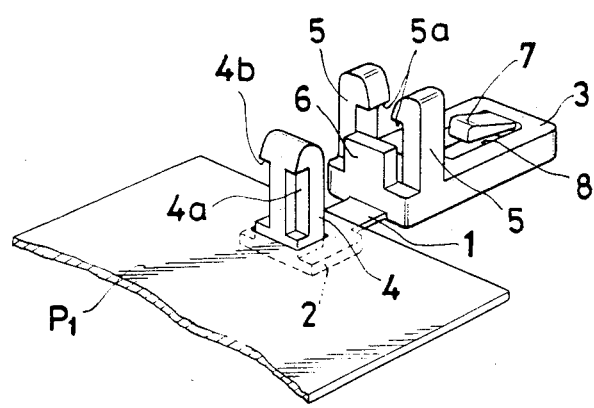
FIG. 2 is a perspective view of the fixing device of FIG. 1 in a state having a fitting shank thereof inserted through a hole bored in a lower sheet part.
Figure 3:
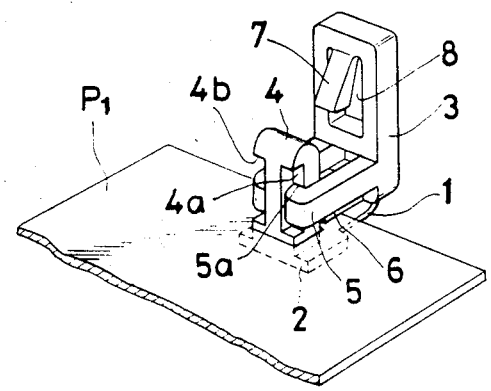
FIG. 3 is a perspective view of the fixing device of FIG. 1 in a state having the lower sheet part fixed in place therewith.

After the hole has been bored in the sheet part $P_1$ as described above, the fitting shank is inserted upwardly through this hole (FIG. 2). The engaging part 3 which is now located outside the edge of the sheet part $P_1$ is raised from the edge by bending the hinge 1 at right angles and the pair of legs 5 are guided to the opposite lateral sides of the fitting shank 4 protruding from the hole of the sheet part $P_1$, and the claws 5a at the leading ends of the legs 5 are caused to embrace therein the fitting shank 4 by virtue of the elasticity of the legs 5 and consequently brought into engagement with the depressions 4a formed on the opposite lateral edges of the fitting shank (FIG. 3). As a result, the edge of the hole is urged toward the fitting shank by the elasticity of the hinge 1 even when the size of the hole formed in the sheet part $P_1$ is slightly larger than that of the fitting shank 4. The base plate, therefore, does not produce any play in the lateral direction thereof. Further when the engaging part 3 is raised upright by bending the hinge 1 perpendicularly, the end face of the engaging part and the contact plate 6 projected from the end face serve to press the edge section of the sheet part $P_1$ against the base plate 2. As a result, the base plate does not produce any play in the vertical direction thereof. Even when the wall thickness of the sheet part is slightly off standard or the position of the hole in the sheet part is slightly off, the fixing device can be fastened safely to the sheet part $P_1$ with a slight variation in the position at which the hinge is bent. In the manner described above, as many fixing devices as required are fastened along the edges of the sheet part $P_1$.

Figure 4:
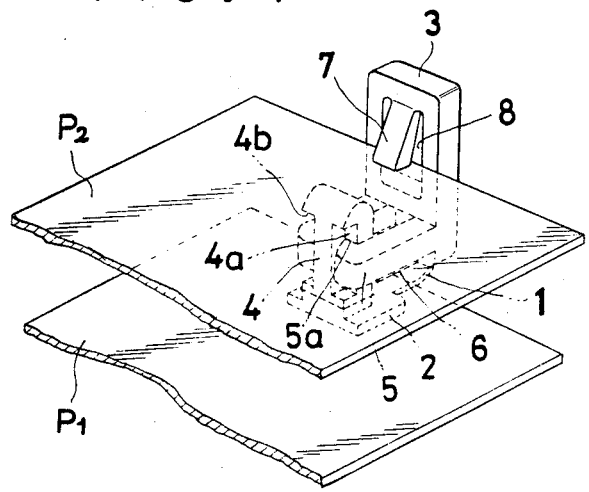
FIG. 4 is a perspective view of the fixing device of FIG. 1 in a state having the lower sheet part and an upper sheet part joined fast therewith.
Figure 5:
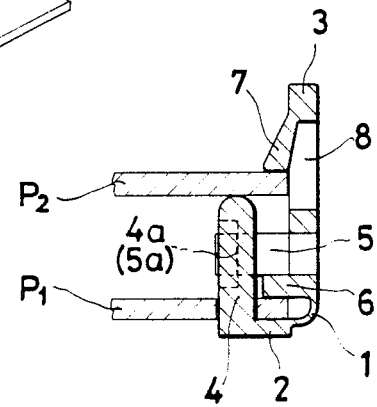
FIG. 5 is a cross section illustrating the fixing device in the state of FIG. 4.

To fix the other sheet part $P_2$ destined to constitute the lower member of the union to the engaging part 3 raised as illustrated in FIG. 3, this part $P_2$ has only to be pressed downwardly from above the retainer claw 7 of the engaging part 3. The lower end of the retainer claw 7 and the top of the fitting shank 4 are separated so much from each other as to produce a gap equalling the thickness of the sheet part $P_2$. As the sheet part $P_2$ is forced into the retainer claw 7 as described above, the retainer claw 7 is depressed into the incision 8. As the sheet part $P_2$ is slid past the leading end of the claw, the retainer claw 7 returns to its original position. As a result, the edge of the sheet part $P_2$ is nipped between the top of the fitting shank 4 and the lower end of the retainer claw 7 (FIG. 4). During the depression of the sheet part $P_2$, the engaging part 3 is also exposed to a force which urges the engaging part rearwardly. Since the pair of legs 5 keep firm hold of the fitting shank 4, however, the retainer claw 7 of each of the fixing devices is pushed into the incision 8 and the sheet part $P_2$ is attached fast to the sheet $P_1$ as separated therefrom by a space equalling the height of the fitting shank. If the rear face of the engaging part should come into contact with the wall face of the machine, this contact offers no hindrance at all to the fixing of the sheet part $P_2$.

Figure 6:
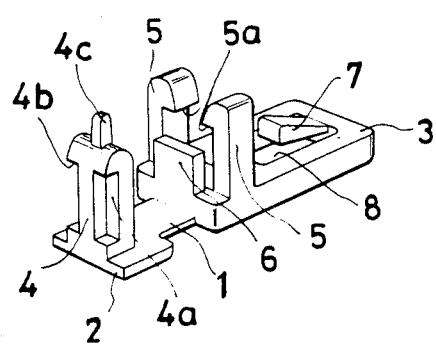
FIG. 6 is a perspective view illustrating a sheet part fixing device as another typical embodiment of this invention.
Figure 7:
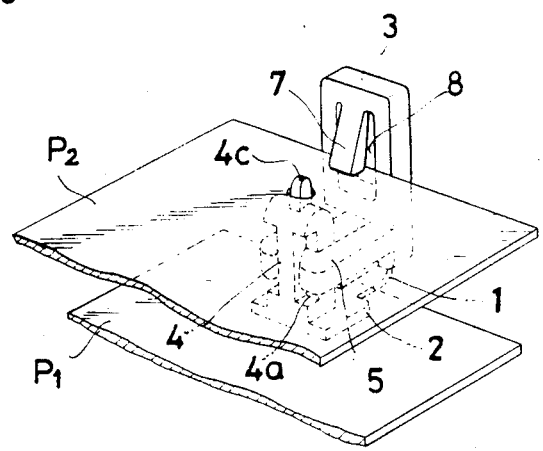
FIG. 7 is a perspective view of the fixing device of FIG. 6 in a state having two sheet parts fixed fast in place therewith.

Optionally, a protuberance 4c may be formed on the top of the fitting shank 4 as illustrated in FIG. 6 and a hole for permitting passage therethrough of this protuberance 4c formed in advance in the sheet $P_2$ at the position at which the top of the fitting shank is expected to collide with the sheet part $P_2$. Then, the sheet part $P_2$ is depressed downwardly toward the retainer claw of the fixing device. As a result, the protuberance 4c on the fitting shank 4 is inserted through the hole of the sheet part $P_2$ and the lateral edges are pressed down by the lower end face of the retainer claw 7. Thus, the sheet part $P_2$ is fixed in place more safely and more acccurately so that the sheet parts are prevented from accidental separation or lateral dislocation even when they are exposed to heavy shocks unexpectedly.

The fixing device of this invention is joined to the sheet part $P_1$ by causing the fitting shank 4 to thrust out of the hole of the sheet part $P_1$ to be nipped between the pair of legs 5 of the engaging part 3 raised upright by bending the hinge 1. Thereafter, the second sheet part $P_2$ is nipped fast in position between the top of the fitting shank nipped by the pair of legs and the retainer claw 7 of the engaging part 3 disposed in a posture parallel to the fitting shank. The height and thickness of the fitting shank, the length and elasticity of the hinge, the length of the legs, the position, size, and urging force of the retainer claw are determined in due consideration of the thickness, shape, and desired fixing strength of the sheet parts, the size and position of the hole, the distance for separating the two sheet parts, and so on.

When the sheet parts are to be replaced because of a malfunction of an element mounted on the sheet parts, the sheet part $P_2$ held in place on the upper side is released from the fixing device by depressing the retainer claw 7 of the engaging part 3 into the incision 8. To release the sheet part $P_2$ held in place on the lower side, the leading end of a screw driver is wedged between the pair of legs 5 which are embracing the fitting shank 4 of the engaging part 3 and the screw driver is manipulated to open the legs. As a result, the engaging claws 5a, at leading ends of the legs break engagement with the fitting shank 4 and the engaging part 3 is pushed outwardly by the urging force of the hinge 1 and the fitting shank 4 fitted into the hole of the sheet part $P_2$ is readily pulled out. The work involved here relies on the elasticity possessed by the synthetic resin of which the components of the fixing device are made. Thus, the fixing device can be used repeatedly without losing its fixing strength.

As fully described above, the fixing device of this invention is so constructed that the upper sheet part $P_2$ is fixed in position by being nipped between the top of the fitting shank 4 and the lower surface of the retainer claw 7 and the lower sheet part $P_1$ is fixed by the fitting shank 4 inserted through the hole formed near the edge of the sheet part and the base part 2. Thus, both the sheet parts can be utilized throughout their areas even to the corners. Since this fixing device is not required to protrude from the bottom surface of the lower sheet part $P_1$ by more than the thickness of the base plate 2, a thickness of about 1 mm is sufficient for the space to be formed below the bottom surface of the base plate. Thus, the fixing device promises effective utility of the space within the electronic apparatus.

What is claimed is:

1. A fixing device formed integrally of synthetic resin and used for union of sheet parts, comprising:
    a hinge part adaped to be bent perpendicularly,
    a base plate connected to one end side of said hinge part and provided with a projecting fitting shank, and
    an engaging part connected to the other end side of said hinge part and provided on the upper inner side thereof with a pair of legs and further provided therein with a tongue-shaped retainer claw possessing an upwardly urged free end, said pair of legs being each provided on the inner side thereof with an engaging claw and spaced from each other, and adapted to embrace said fitting shank therein when said hinge part is bent perpendicularly.

2. A fixing device according to claim 1, which further comprises a contact plate juxtaposed to the joint between said engaging part and said hinge part.

* * * * *